United States Patent
Bae et al.

(10) Patent No.: US 7,787,278 B2
(45) Date of Patent: Aug. 31, 2010

(54) RESISTANCE VARIABLE MEMORY DEVICE AND OPERATING METHOD THEREOF

(75) Inventors: Jun-Soo Bae, Hwaseong-si (KR); Hideki Horii, Seoul (KR); Mi-Lim Park, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 12/229,341

(22) Filed: Aug. 22, 2008

(65) Prior Publication Data

US 2009/0052236 A1 Feb. 26, 2009

(30) Foreign Application Priority Data

Aug. 24, 2007 (KR) .................... 10-2007-0085591

(51) Int. Cl.
*G11C 17/00* (2006.01)
(52) U.S. Cl. .................. 365/100; 365/163; 365/148; 365/46; 365/189.04; 365/210.1
(58) Field of Classification Search ............... 365/163, 365/100, 148, 46, 189.04, 210.1
See application file for complete search history.

(56) References Cited

U.S. PATENT DOCUMENTS

| 6,625,054 | B2 | 9/2003 | Lowrey et al. |
| 2005/0083773 | A1* | 4/2005 | Hidaka .................... 365/232 |
| 2008/0084734 | A1* | 4/2008 | De Brosse et al. .......... 365/163 |

* cited by examiner

*Primary Examiner*—Thong Q Le
(74) *Attorney, Agent, or Firm*—Mills & Onello, LLP

(57) ABSTRACT

Provided is a resistance variable memory device and a method for operating same. The resistance variable memory device has a phase change material between a top electrode and a bottom electrode. In the method for operating a resistance variable memory, the write current is applied in a direction from the top electrode to the bottom electrode, and the read current is applied in a direction from the bottom electrode to the top electrode. The phase change material is programmed by applying the write current, and a resistance drift of the phase change material is restrained by applying the read current.

20 Claims, 7 Drawing Sheets

Fig. 8

| Program to read delay | ①Fwd_W / Fwd_R | | ②Rvs_W / Fwd_R | | ③Fwd_W / Rvs_R | |
|---|---|---|---|---|---|---|
| T(sec) | R(Ω) | Drift(%) | R(Ω) | Drift(%) | R(Ω) | Drift(%) |
| 5 | 893,471 | 100.0 | 412,288 | 100.0 | 409,364 | 100.0 |
| 180 | 1,160,985 | 129.9 | 504,506 | 122.4 | 447,147 | 109.2 |
| 300 | 1,243,742 | 139.2 | 511,680 | 124.1 | 501,111 | 122.4 | ns
RESISTANCE VARIABLE MEMORY DEVICE AND OPERATING METHOD THEREOF

CROSS-REFERENCE TO RELATED APPLICATIONS

This U.S. non-provisional patent application claims priority under 35 U.S.C. §119 of Korean Patent Application No. 10-2007-0085591, filed on Aug. 24, 2007, the entire contents of which are hereby incorporated by reference.

FIELD OF THE INVENTION

The present invention disclosed herein relates to a memory device, and more particularly, to a resistance variable memory device and an operating method thereof.

BACKGROUND

Demands for a semiconductor memory device realizing high integration and high capacity have steadily increased. An example of such a semiconductor device is a flash memory, which is mainly used in potable electronic devices. In addition, semiconductor memory devices having a non-volatile material instead of a capacitor, as used in DRAM, have emerged.

For example, such semiconductor devices include a ferroelectric RAM (FRAM) using a ferroelectric capacitor, a magnetic RAM (MRAM) using a tunneling magneto-resistive (TMR) layer, and a phase change memory device using chalcogenide alloys. In particular, a resistance variable memory device, such as the phase change memory device, can be manufactured by a relatively simple process and embodied into a high capacity memory at a relatively low cost.

FIG. 1 illustrates a memory cell of a typical resistance variable memory device. Referring to FIG. 1, a memory cell 10 of a resistance variable memory device includes a variable resistor C and an access transistor M.

The variable resistor C is connected to a bit line BL. The access transistor M is connected between the variable resistor C and a ground terminal. A word line WL is connected to a gate of the access transistor M. When a predetermined voltage is applied to the word line WL, the access transistor M is turned on. When the access transistor M is turned on, the variable resistor C receives a current $I_c$ via the bit line BL.

The variable resistor C includes a phase change material (not shown). The phase change material has two stable states, that is, a crystal state or an amorphous state—according to temperature. That is the phase change material is changed into the crystal state or the amorphous state in accordance with a current $I_c$ supplied via the bit line BL. The phase change memory device programs data using the above property of the phase change material.

FIG. 2 is a graph illustrating the property of a phase change material. The reference numeral 1 shows a condition for the phase change material to be changed into an amorphous state, and the reference numeral 2 shows a condition for the phase change material to be changed into a crystal state.

Referring to FIG. 2, a phase change material (such as "GST") is changed into the amorphous state after being heated above the melting temperature Tm by supplying the current $I_c$ for duration T1. GST is a chalcogenide alloy of germanium, antimony and tellurium (GeSbTe). The amorphous state is usually referred to as a reset state, and data '1' is stored in this state.

In contrast, the phase change material is changed into the crystal state after being heated between a crystallization temperature Tc and the melting temperature Tm for duration T2, which is longer than T1. The crystal state is commonly referred to as a set state, and data '0' is stored in this state. A memory cell has the characteristic that its resistance varies according to an amorphous volume of the phase change material. The resistance of the memory cell is highest at the amorphous state, and lowest at the crystal state.

In recent years, a technology for storing two or more bits of data at one memory cell has been developed. This memory cell is called a multi-level cell (MLC), and has a multi-state according to the resistance distribution. In a resistance variable memory device, the MLC further includes intermediate states between the reset state and the set state. A method for programming a resistance variable memory device having the MLC is disclosed in U.S. Pat. No. 6,625,054 (hereinafter, referred to as '054 patent').

FIGS. 3A through 3D are graphs illustrating a method of programming a resistance variable memory device having a typical MLC, where each of FIGS. 3A-3D represents a different set of programming signals, in accordance with the prior art. The programming method as illustrated in FIGS. 3A-3D is disclosed in the 054 patent. Referring to FIGS. 3A-3D, different times T0-T11 are denoted on the TIME axis and currents I0 (min), I1(max in FIGS. 3A, B, D) and I2 (max in FIG. 3C) are denoted on the CURRENT axis. The memory cell represented in each figure includes four states according to a falling time of a program pulse. A case where the memory cell is in a reset state is called a state "11", and a case where the memory cell is in a set state is called a state "00". The memory cell further has a state "10" and a state "01" in accordance with an amorphous volume of a phase change material.

According to the 054 patent, the phase change memory device programs two bits into one memory cell by controlling the falling time of the current pulse applied to the memory cell. The 054 patent uses a characteristic that the amorphous volume of the phase change material decreases as the falling time of the current pulse increases.

There should be no difference between a resistance at several nanoseconds after programming and a resistance at several or several tens of days after programming so that the typical resistance variable memory device, e.g., the resistance variable memory device in the 054 patent, performs a normal MLC operation. However, the resistance of the resistance variable memory device will vary according to a lapse of time due to the property of the phase change material (GST). This phenomenon is called resistance drift, which can negatively affect the reliability of the device. It would be advantageous to devise a resistance variable memory device that minimizes or substantially eliminates resistance drift.

SUMMARY

In accordance with aspects of the present invention, there is provided a resistance variable memory device and an operating method thereof, which can restrain a resistance drift.

In accordance with one aspect of the present invention, provided is a method for operating a resistance variable memory device having a phase change material between a top electrode and a bottom electrode. The method includes applying a write current to program the phase change material; and applying a read current to read data stored at the phase change material, while the write current is being applied, wherein the directions of the write current and the read current are opposite to each other.

The write current can be applied in a direction from the top electrode to the bottom electrode, and the read current can be applied in a direction from the bottom electrode to the top electrode.

The phase change material can be programmed by applying the write current, and a resistance drift of the phase drift material can be restrained by applying the read current.

The read current can be applied in a dummy read operation performed after a program operation.

The read current can be applied in a normal read operation.

In either case the phase change material can be configured to take one of multiple states, each having a different resistance. The multiple states can be "00", "01", "10" and "11."

The write current can be in the first direction from the bottom electrode to the top electrode, and the read current can be in a direction from the top electrode to the bottom electrode.

The phase change material can be programmed by applying the write current, and a resistance drift of the phase drift material can be restrained by applying the read current.

The read current can be applied in a dummy read operation performed after a program operation.

The read current can be applied in a normal read operation.

In either case, the phase change material can be configured to take one of multiple states, each having different resistance. The multiple states can be four states "00", "01", "10" and "11" according to a resistance.

In accordance with another aspect of the present invention, provided is a resistance variable memory device that includes: a phase change material configured to simultaneously pass a write current for programming the phase change material in a first direction and a read current for reading data stored at the phase change material in a second direction opposite the first direction.

The phase change material can be connected between a top electrode and a bottom electrode and be configured to change into an amorphous state at the bottom electrode.

The write current can flow in the first direction from the top electrode to the bottom electrode, and the read current can flow in the second direction from the bottom electrode to the top electrode.

In such a case, the applied read current can restrain a resistance drift of the phase change material.

The write current can flow in the first direction from the bottom electrode to the top electrode, and the read current can flow in the second direction from the top electrode to the bottom electrode.

In such a case, the applied read current can restrain a resistance drift of the phase change material.

The phase change material can be configured to take one of multi-states, each state having a different resistance.

In accordance with still other aspects of the present invention, provided is a memory system that includes: a resistance variable memory device; and a memory controller configured to control the resistance variable memory device, wherein the resistance variable memory device is configured to simultaneously pass a write current for programming a phase change material in a first direction and a read current for reading data stored at the phase change material in a second direction opposite the first direction.

The phase change material can be connected between a top electrode and a bottom electrode, wherein the write current flows in the first direction from the top electrode to the bottom electrode, and the read current flows in the second direction from the bottom electrode to the top electrode.

The phase change material can be connected between a top electrode and a bottom electrode, wherein the write current flows in the first direction from the bottom electrode to the top electrode, and the read current flows in the second direction from the top electrode to the bottom electrode.

BRIEF DESCRIPTION OF THE FIGURES

The accompanying figures are included to provide a further understanding of the present invention, and are incorporated in and constitute a part of this specification. The drawings illustrate exemplary embodiments in accordance with the present invention and, together with the description, serve to explain principles of the present invention. In the figures:

FIG. 8 is a table illustrating a restraint effect on a resistance drift depending on current directions of FIGS. 4 through 6;

DETAILED DESCRIPTION OF PREFERRED EMBODIMENTS

Hereinafter, aspects of the present invention will be described with the accompanying drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/ or components, but do not preclude the presence or addition of one or more other features, steps, operations, elements, components, and/or groups thereof.

Spatially relative terms, such as "beneath," "below," "lower," "bottom," "above," "upper," "top," and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 1:
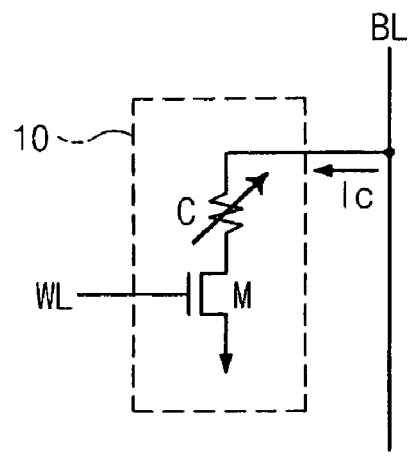
FIG. 1 illustrates a memory cell of a typical resistance variable memory device.
Figure 2:
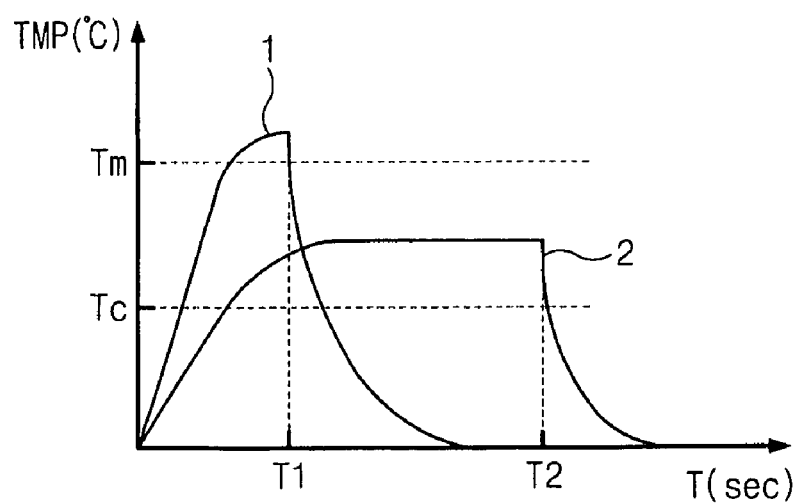
FIG. 2 is a graph illustrating the property of a phase change material.
Figure 3A:
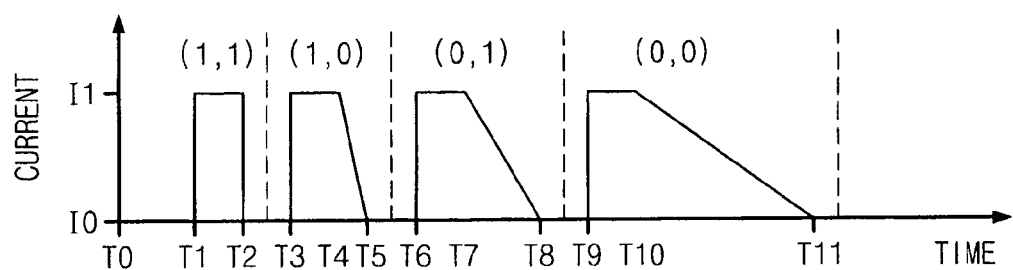
FIGS. 3A through 3D show graphs illustrating a method for programming a resistance variable memory device having a typical multi-level cell (MLC)
Figure 3B:
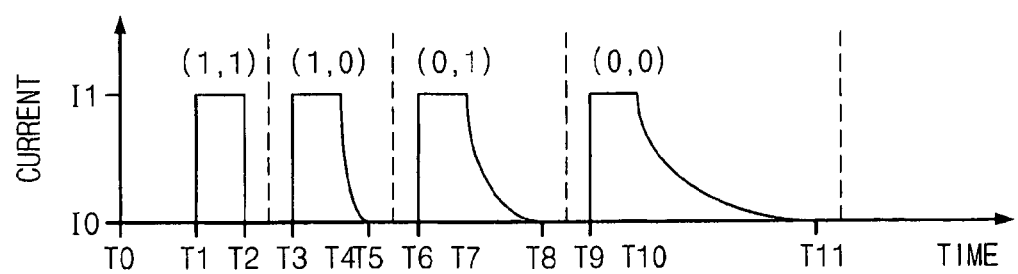
Figure 3C:
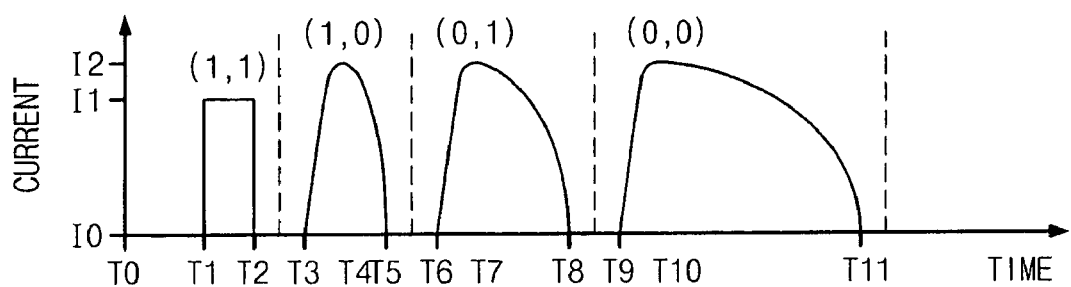
Figure 3D:
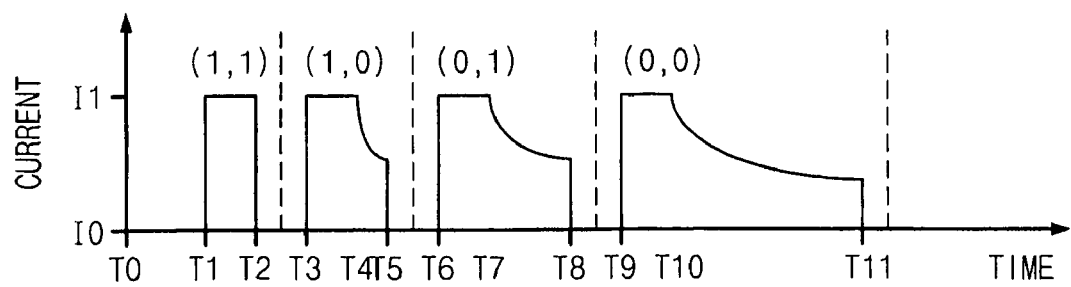
Figure 4:
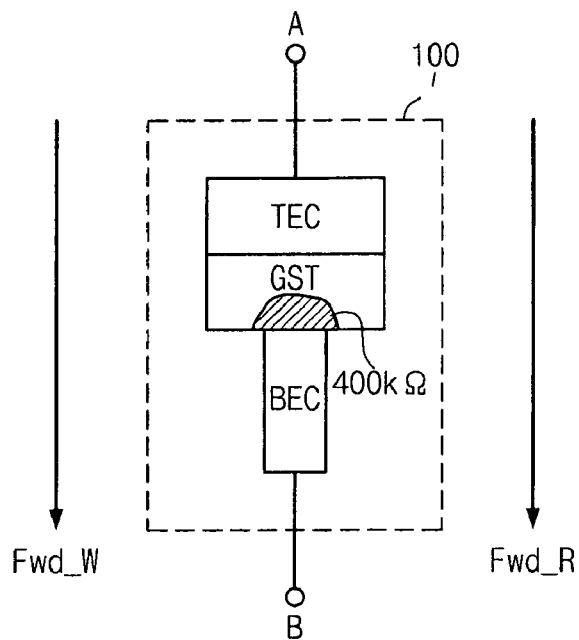
FIGS. 4 through 7 are diagrams exemplarily illustrating directions of a write current and a read current in an embodiment of a resistance variable memory device according to aspects of the present invention.
Figure 5:
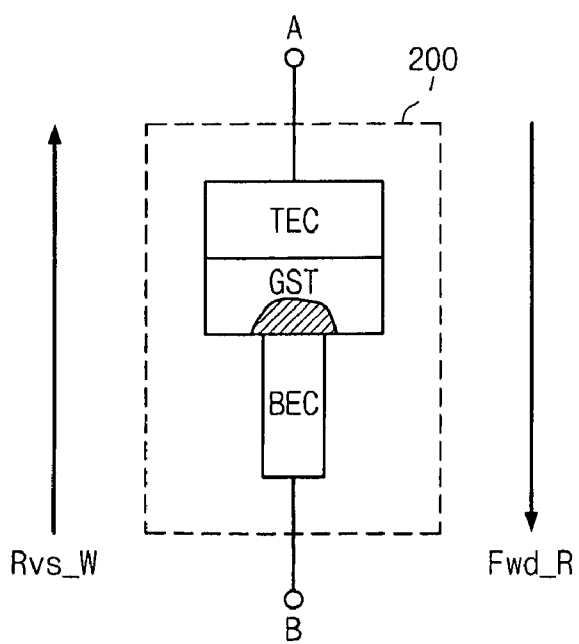
Figure 6:
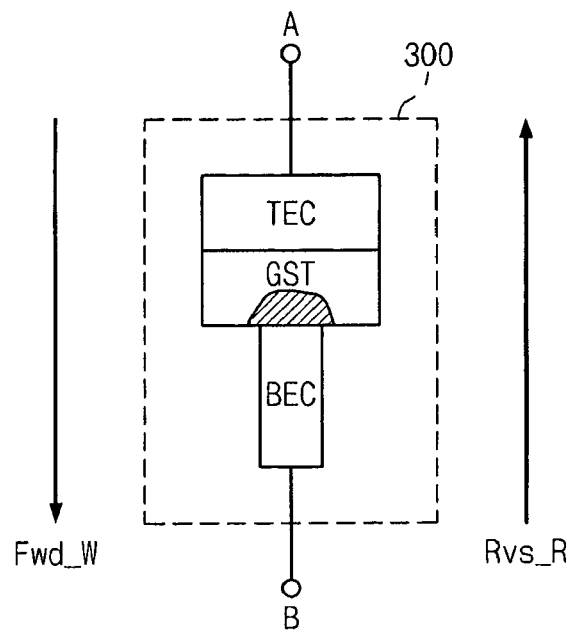

FIGS. 4 through 7 are diagrams exemplarily illustrating directions of a write current and a read current in an embodiment of a resistance variable memory device according to aspects of the present invention. The resistance variable memory device restrains a resistance drift by applying the write current and the read current in opposite directions to each other. The restraint effect of the resistance drift is improved as the resistance of the phase change material (GST) decreases. In FIGS. 4 through 6 an initial resistance of the phase change material (GST) is about 400 kΩ, and in FIG. 7 the initial resistance is about 100 kΩ, in the present embodiment.

FIG. 4 shows directions of the write current and the read current in a resistance variable memory device. Referring to FIG. 4, a variable resistor 100 includes a phase change material (GST). The phase change material (GST) is connected between a top electrode TEC and a bottom electrode BEC. The top electrode TEC is connected to a bit line (not shown), and the bottom electrode is connected to a select element (not shown).

The phase change material (GST) has a variable resistance value according to an amorphous volume. The resistance value is proportional to the amorphous volume. A program state is divided into a crystal state having a low resistance and an amorphous state having a high resistance. The crystal state, in which data '0' is stored, is called a set state. The amorphous state, in which data '1' is stored, is called a reset state. A single level cell (SLC) stores data '0' or '1' in one memory cell.

The memory cell may include various intermediate states between the crystal state and the amorphous state, which is called a multi-level cell (MLC). The multi-level cell (MLC) can store two or more bits of data in one memory cell. The memory cell has one of the multi-states based on an MLC program operation. For example, assuming that two bits of data are stored at one memory cell, the memory cell has four states "11", "10", "01" and "00".

A state "11", which is called a reset state, has the highest resistance value. A state "00", which is called a set state, has the lowest resistance value. States "10" and "01", which are first and second intermediate states, have a first and a second intermediate resistance values, respectively. A resistance value of the state "10" is larger than a resistance value of the state "01".

Referring to FIG. 4, a write current and a read current are applied in a direction from a top electrode to a bottom electrode, that is, in A-B direction, which are referred to as a forward write current Fwd_W and a forward read current Fwd_R, respectively. In contrast, currents applied in a direction (from the bottom electrode to the top electrode, i.e., in B-A direction, are referred to as a reverse write current Rvs_W (see FIG. 5) and a reverse read current Rvs_R (see FIGS. 6 and 7), respectively.

A typical resistance variable memory device, as illustrated in FIG. 4, applies the forward write current Fwd_W in a program operation, and the forward read current Fwd_R in a read operation. In the typical resistance variable memory device, a read error may occur due to a resistance drift. In the resistance variable memory device according to aspects of the present invention, however, a write current and a read current flow in opposite directions, thus restraining the resistance drift.

FIG. 5 illustrates a method for operating a resistance variable according to a first embodiment in accordance with the present invention. Referring to FIG. 5, a write current is applied in a direction from a bottom electrode to a top electrode, i.e., in B-A direction, and a read current is applied in a direction from a top electrode to a bottom electrode, i.e., in A-B direction.

Here, a forward read current Fwd_R may be a current applied in a normal read operation, or it may be a dummy read current applied after a program operation. The resistance variable memory device according to an embodiment of the present invention restrains the resistance drift by applying a reverse write current Rvs_W and a forward read current Fwd_R.

FIG. 6 illustrates a method for operating a resistance variable memory device according to a second embodiment in accordance with the present invention. Referring to FIG. 6, a write current is applied in a direction from a top electrode to a bottom electrode, that is, in A-B direction. A read current is applied in a direction from a bottom electrode to a top electrode, that is, in B-A direction.

Here, the reverse read current Rvs_R may be a current applied in a normal read operation, or it may be a dummy read current applied after a program operation. A resistance variable memory device according to an embodiment of the present invention restrains a resistance drift by applying a forward write current Fwd_W and a reverse read current Rvs_R.

According to an experimental result, it can be verified that the method as illustrated in FIG. 6 has more significant restraint effect on the resistance drift than the method as illustrated in FIG. 5. According to the method as illustrated in FIG. 5, reproducibility may be reduced in the reverse write operation, and a resistance value may not be stably obtained. Accordingly, it can be preferable for the resistance variable memory device to apply a forward write current Fwd_W and a reverse read current Rvs_R as illustrated FIG. 6.

Figure 7:
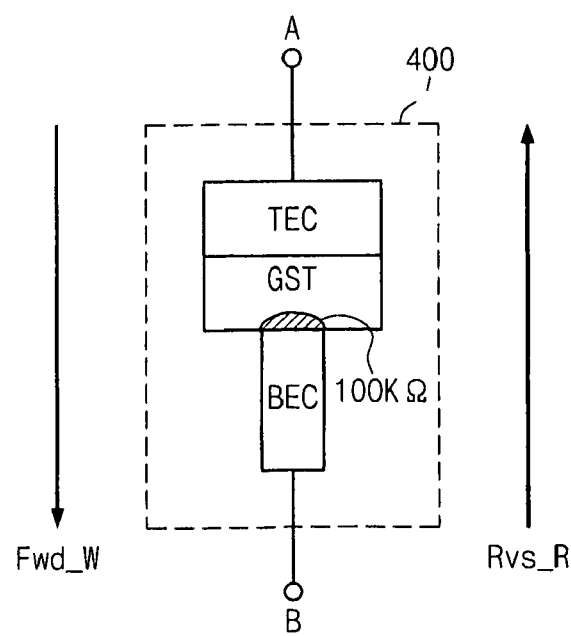

When using the method as illustrated FIG. 6, a resistance drift is reduced as an initial resistance gets lower. FIG. 7 shows that an initial resistance is 100 kΩ, and a forward write current Fwd_W and a reverse read current Rvs_R are applied. Referring to FIG. 7, it can be understood that an amorphous volume of a phase change material (GST) is smaller than that in FIG. 6 in a variable resistor 400

FIG. 8 is a table illustrating a restraint effect on a resistance drift depending on current directions of FIGS. 4 through 6. FIG. 8 is experimental data obtained when an initial resistance is about 400 kΩ. Due to the resistance drift, the initial resistance varies as time passes.

First, the situation demonstrated with respect to FIG. 4 corresponds to a case where a forward write current Fwd_W and a forward read current Fwd_R are applied. According to FIG. 4, a variable resistor 100 has a resistance of about 390 kΩ after 5 seconds, about 1.1 MΩ after 180 seconds, and about 1.2 MΩ after 300 seconds. The variable resistor 100 as illustrated in FIG. 4 shows drift variations of about 129.9% and 139.2% on the basis of the resistance value after 5 seconds.

Second, the situation demonstrated with respect to FIG. 5 corresponds to a case where a reverse write current Rvs_W and a forward read current Fwd_R are applied. According to FIG. 5, a variable resistor 200 has a resistance of about 412 kΩ after 5 seconds, about 505 kΩ after 180 seconds and about 512 kΩ after 300 seconds. The variable resistor 200 as illustrated in FIG. 5 shows drift variations of about 122.4% and 124.1% on the basis of the resistance value after 5 seconds. Therefore, it can be verified that the variable resistor illustrated with respect to FIG. 5 has more significant restraint effect on the resistance drift than the variable resistor illustrated with respect to FIG. 4.

Third, the situation demonstrated with respect to FIG. 6 corresponds to a case where a forward write current Fwd_W and a reverse read current Rvs_R are applied. According to FIG. 6, a variable resistor 300 has about 409 kΩ after 5 seconds, about 447 kΩ after 180 seconds and about 501 kΩ after 300 seconds. The variable resistor 300 as illustrated in FIG. 6 shows drift variations of about 109.2% and 122.4% on the basis of the resistance value after 5 seconds. Therefore, it can be verified that the variable resistor illustrated with respect to FIG. 6 has more significant restraint effect on the resistance drift than the variable resistors of illustrated in FIGS. 4 and 5.

Figure 9:
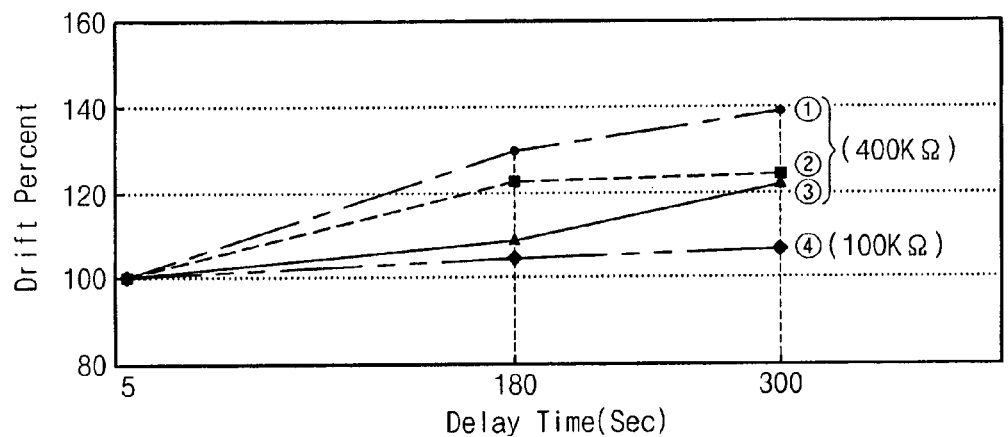
FIG. 9 is a graph illustrating the result of the experiment as illustrated in FIG. 8.

FIG. 9 is a graph illustrating the result of the experiment as illustrated in FIG. 8. FIG. 9 shows that the restraint effect on the resistance drift is improved as the initial resistance is decreased. Referring to FIG. 9, a symbol ① is the experimental result by the method described with respect to FIG. 4, a symbol ② is the experimental result by the method described with respect to FIG. 5, a symbol ③ is the experimental result by the method described with respect to FIG. 6, and a symbol ④ is the experimental result by the method described with respect to FIG. 7. In the variable resistor of the FIG. 7, the initial resistance is 100 kΩ.

FIG. 9 verifies that a resistance drift is restrained when directions of the write current and the read current are opposed to each other. In addition, the resistance drift is further restrained as the initial resistance is decreased.

The resistance drift may be a more serious limitation in an MLC operation. A memory cell may not be significantly affected in a fully crystal state "00" or a fully amorphous state "11". This is because there is no resistance drift in the fully crystal state and no level for an overlap in the fully amorphous state.

However, the resistance drift may be a limitation when the memory cell is programmed into an intermediate state "10" or "01". On an occurrence of the resistance drift, there may be an overlap of program states, causing a read error. In the resistance variable memory device according to embodiments of the present invention, directions of the write current and the read current are opposed to each other, thereby solving a limitation due to a resistance drift, especially, in an MLC operation.

Figure 10:
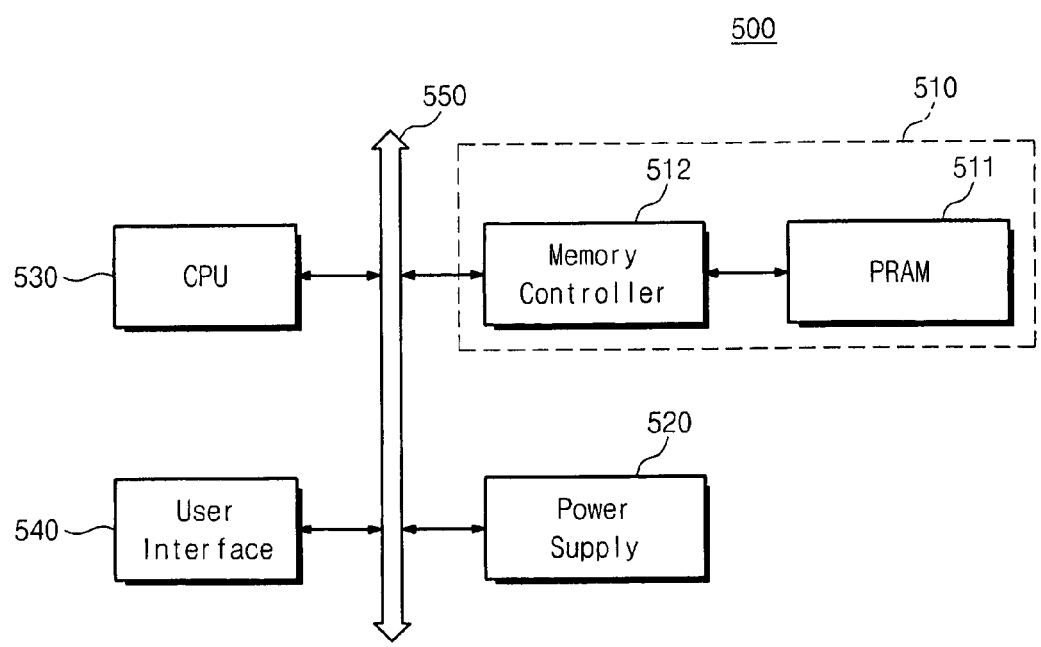
FIG. 10 is a block diagram embodiment of a computing system including a resistance variable memory device according to the present invention.

FIG. 10 is a block diagram of an embodiment of a computing system 500 including a resistance variable memory device according to aspects of the present invention. Referring to FIG. 10, the computing system 500 includes a flash memory system 510, a central processing unit (CPU) 530, a user interface 540, and a power supply 520. The flash memory system 510 includes a resistance variable change memory device 511 (e.g., a phase-change random access memory (PRAM)) and a memory controller 512. The CPU is electrically connected to a system bus 550.

The resistance variable change memory device 511 stores data through the memory controller 512. The data is received from the user interface 540 or processed by the CPU. The memory system may be used as a semiconductor disc device SSD, as an example. In such a case, a booting speed of the computing system 500 remarkably increases.

Although not shown, it would be appreciated by those having an ordinary skill in the art that the computing system 500 may further include an application chipset, a camera image processor CIS, and a mobile DRAM, and so on.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for operating a resistance variable memory device having a phase change material between a top electrode and a bottom electrode, the method comprising:
   applying a write current to program the phase change material; and
   applying a read current to read data stored at the phase change material, while applying the write current,
   wherein the directions of the write current and the read current are opposite to each other, and
   wherein the read current is configured to be applied in a dummy read operation performed after a program operation.

2. The method of claim 1, including applying the write current in a direction from the top electrode to the bottom electrode, and applying the read current in a direction from the bottom electrode to the top electrode.

3. The method of claim 2, wherein the phase change material is programmed by applying the write current, and a resistance drift of the phase drift material is restrained by applying the read current.

4. The method of claim 3, including applying the read current in the dummy read operation performed after a program operation.

5. The method of claim 3, including applying the read current in a normal read operation.

6. The method of claim 1, including applying the write current in a direction from the bottom electrode to the top electrode, and including applying the read current in a direction from the top electrode to the bottom electrode.

7. The method of claim 6, wherein the phase change material is programmed by applying the write current, and a resistance drift of the phase drift material is restrained by applying the read current.

8. The method of claim 7, including applying the read current in the dummy read operation performed after a program operation.

9. The method of claim 7, including applying the read current in a normal read operation.

10. The method of claim 6, wherein the phase change material is configured to take one of multiple states, each state having a different resistance.

11. A resistance variable memory device comprising: having
- a phase change material configured to simultaneously pass a write current for programming the phase change material in a first direction and a read current for reading data stored at the phase change material in a second direction opposite to the first direction,
- wherein the read current is configured to be applied in a dummy read operation performed after a program operation.

12. The resistance variable memory device of claim 11, wherein the phase change material is connected between a top electrode and a bottom electrode and configured to change into an amorphous state at the bottom electrode.

13. The resistance variable memory device of claim 12, wherein the write current flows in the first direction from the top electrode to the bottom electrode, and the read current flows in the second direction from the bottom electrode to the top electrode.

14. The resistance variable memory device of claim 13, wherein the applied read current restrains a resistance drift of the phase change material.

15. The resistance variable memory device of claim 12, wherein the write current flows in the first direction from the bottom electrode to the top electrode, and the read current flows in the second direction from the top electrode to the bottom electrode.

16. The resistance variable memory device of claim 15, wherein the applied read current restrains a resistance drift of the phase change material.

17. The resistance variable memory device of claim 11, wherein the phase change material is configured to take one of multi-states, each state having a different resistance.

18. A memory system, comprising:
- a resistance variable memory device; and
- a memory controller configured to control the resistance variable memory device,
- wherein the resistance variable memory device is configured to simultaneously pass a write current for programming a phase change material in a first direction and a read current for reading data stored at the phase change material in a second direction opposite the first direction, and
- wherein the read current is configured to be applied in a dummy read operation performed after a program operation.

19. The memory system of claim 18, wherein the phase change material is connected between a top electrode and a bottom electrode, wherein
- the write current flows in the first direction from the top electrode to the bottom electrode, and the read current flows in the second direction from the bottom electrode to the top electrode.

20. The memory system of claim 18, wherein the phase change material is connected between a top electrode and a bottom electrode, wherein
- the write current flows in the first direction from the bottom electrode to the top electrode, and the read current flows in the second direction from the top electrode to the bottom electrode.

* * * * *